United States Patent [19]

Nakamura

[11] Patent Number: 5,793,109
[45] Date of Patent: Aug. 11, 1998

[54] STRUCTURE OF OHMIC ELECTRODE FOR SEMICONDUCTOR BY ATOMIC LAYER DOPING

[75] Inventor: Kiyoto Nakamura, Miyagi, Japan

[73] Assignee: Advantest Corp., Tokyo, Japan

[21] Appl. No.: 703,105

[22] Filed: Aug. 26, 1996

[30] Foreign Application Priority Data

Aug. 25, 1995 [JP] Japan .................................... 7-240577

[51] Int. Cl.[6] .................... H01L 23/48; H01L 31/0257; H01L 27/095; H01L 29/20
[52] U.S. Cl. .................... 257/745; 257/76; 257/473; 257/615; 257/764; 257/767
[58] Field of Search ..................... 257/73, 76, 155, 257/449, 453, 471, 472, 473, 194, 745, 615

[56] References Cited

U.S. PATENT DOCUMENTS 5,399,886  3/1995  Hasegawa .......................... 257/192
5,610,410  3/1997  Imanishi ............................. 257/76

*Primary Examiner*—Teresa M. Arroyo
*Attorney, Agent, or Firm*—Muramatsu & Associates

[57] ABSTRACT

An ohmic contact electrode for a semiconductor device which has a low contact resistance and high stability. The ohmic contact electrode includes: a semiconductor substrate; an atomic doping layer developed on the semiconductor substrate wherein the atomic doping layer is formed by doping impurities such that an energy level of the layer is higher than a Fermi level; a semiconductor layer developed on the atomic doping layer wherein the semiconductor layer is formed of the same material as in the semiconductor substrate; a metal electrode formed on the semiconductor layer for establishing an electric connection with the semiconductor substrate; wherein the semiconductor layer has a thickness sufficient for carriers to transfer between the metal electrode and the atomic doping layer by tunneling through the semiconductor layer.

3 Claims, 3 Drawing Sheets

STRUCTURE OF OHMIC ELECTRODE FOR SEMICONDUCTOR BY ATOMIC LAYER DOPING

FIELD OF THE INVENTION

This invention relates to a structure and method of an ohmic contact electrode for electric connecting semiconductor and metal, and more particularly, to an ohmic contact electrode structure for decreasing a contact resistance between semiconductor and metal with the use of an atomic doping layer and to a production process of such an ohmic contact having an atomic doping layer.

BACKGROUND OF THE INVENTION

In establishing an ideal ohmic contact surface between semiconductor and metal in a semiconductor device, it is required that (1) a voltage-current curve be linear and symmetrical in a contact area between the semiconductor and the metal, and (2) a contact resistance be sufficiently low.

Electric current, which is directly related to the contact resistance in the contact surface, is dependent upon a height of Schottky barrier, temperature and a doping density in the contact area. To decrease the contact resistance, it is necessary to lower the Schottky barrier or increase an electron density or concentration in the neighborhood of the contact area.

In the past, as means for decreasing the Schottky barrier, it is used a material having a low Schottky barrier or alloy materials to lower the Schottky barrier. As means for forming a high electron concentration layer in the neighborhood of the contact area, an epitaxial growth or diffusion control growth process is usually used.

With the increase of an component density and reliability in semiconductor devices, it has become especially necessary to have low contact resistance and high temperature stabilities in the boundaries of semiconductor and metal in the semiconductor devices.

As noted above, in the conventional technology for decreasing the Schottky barrier, it is used either materials having a low Schottky barrier or alloying materials which can lower the Schottky barrier. However, in the former, such materials suitable for decreasing the Schottky barrier are limited and are often incompatible with the semiconductor. In the latter, it is difficult to form an alloy layer of uniform depth or thickness, and ordinarily, a semiconductor device having such an alloy layer has a lesser thermal stability.

Further, as noted above, a high electron concentration layer is formed in the neighborhood of the contact area by an epitaxial growth or diffusion control growth process. However, for the purpose of improving a productivity, there is a need of an easier and more stabilized method for forming an electrode in the semiconductor devices.

SUMMARY OF THE INVENTION

It is, therefore, an object of the present invention to provide a structure of ohmic contact electrode for a semiconductor device which has low contact resistance and high temperature stability.

It is another object of the present invention to provide a structure of ohmic contact electrode for a semiconductor device which is easily be produced with high stability and thus with low cost and has high productivity.

The ohmic contact electrode of the present invention is formed of a semiconductor substrate, a metal electrode provided on said semiconductor substrate, and an atomic doping layer formed in an area of the semiconductor substrate close to a boundary of the semiconductor substrate and the metal electrode.

One aspect of the present invention is a structure of an ohmic contact electrode for a semiconductor device. The ohmic contact electrode of the present invention includes: a semiconductor substrate; an atomic doping layer developed on the semiconductor substrate wherein the atomic doping layer is formed by doping impurities such that an energy level of the layer is higher than a Fermi level; a semiconductor layer developed on the atomic doping layer wherein the semiconductor layer is formed of the same material as in the semiconductor substrate; a metal electrode formed on the semiconductor layer for establishing an electric connection with the semiconductor substrate; wherein the semiconductor layer has a thickness sufficient for carriers to transfer between the metal electrode and the atomic doping layer by tunneling through the semiconductor layer.

Another aspect of the present invention is a method of producing an ohmic contact electrode for a semiconductor device. The method of the present invention includes the following steps of: forming a semiconductor substrate; developing an atomic doping layer on the semiconductor substrate wherein the atomic doping layer is formed by doping impurities such that an energy level of the layer is higher than a Fermi level; forming a semiconductor layer on the atomic doping layer wherein the semiconductor layer is the same material as the semiconductor substrate with thickness sufficient for carriers to tunnel therethrough; and, forming a metal electrode on the semiconductor layer for establishing an electric connection with the semiconductor substrate.

According to the present invention, the atomic doping layer is formed in an area of the semiconductor closer to a junction of the semiconductor and the metal electrode. By this arrangement, the Schottky barrier between the semiconductor and the metal is lowered, which realizes an ideal ohmic contact electrode. The ohmic contact electrode of the present invention has lower contact resistance and higher contact stability. Since the contact characteristics of the ohmic contact electrode is directly dependent of the doping level and the position of the doping layer, production of the electrode can be made easily with high efficiency and low cost.

DETAILED DESCRIPTION OF THE PREFERRED EMBODIMENT

Figure 1:
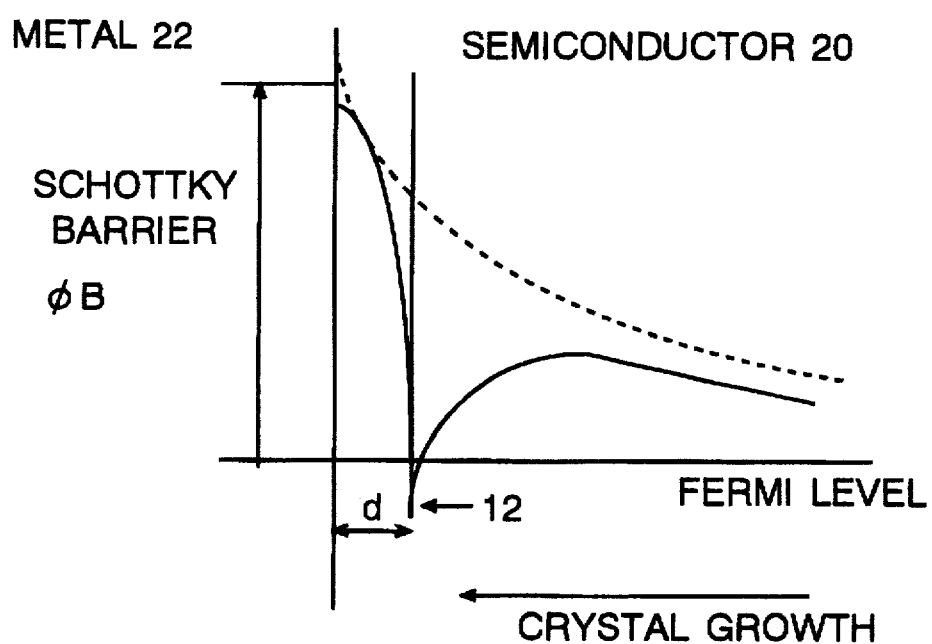
FIG. 1 is a schematic diagram showing energy bands in a boundary area between semiconductor and metal when impurities are doped in the semiconductor.
Figure 2:
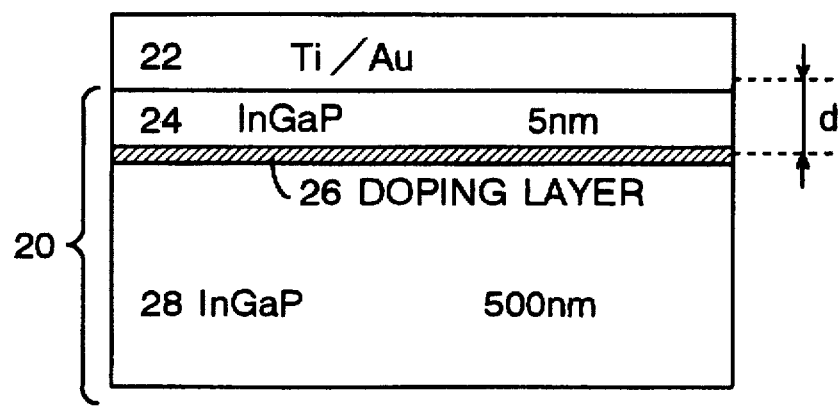
FIG. 2 is a cross sectional diagram showing a structure of a prototype ohmic contact electrode of the present invention.

An example of structure of the ohmic contact electrode in accordance with the present invention is shown FIG. 2 wherein an electrode formed by a metal layer is provided on semiconductor substrate. The energy levels in the boundary area of the metal layer and the semiconductor of FIG. 2 are shown in FIG. 1.

In the present invention, in an area close to a boundary between a metal electrode 22 and semiconductor 20, impurities are doped to form an atomic layer doping to realize an ohmic contact having high stability and low contact resistance. This atomic layer doping is also called planar doping wherein impurities are doped in semiconductor crystals to establish electrical resistance. The impurities are doped in a common atomic layer of the semiconductor and, thus the impurities are distributed in a delta function manner. Thus, atomic layer doping is also called delta doping. A delta doping layer is a highly doped, very thin layer of several nanometer.

The atomic layer doping will be performed by a molecular beam epitaxy or a vapor phase epitaxy. In the following example of this invention, the molecular beam epitaxy such as for growing gallium arsenide crystal is used, although other process of crystal growth is also available.

A structure of a preferred embodiment of the present invention is shown in FIG. 2 wherein indium gallium phosphorus (InGaP) is used as the semiconductor 20, and titanium/gold (Ti/Au) is used as the metal electrode 22. Further, in this example, silicon is used as impurities to be doped in the semiconductor 20. The process of forming the electrode structure of FIG. 2 is as follows:

(1) Form a semiconductor substrate 28 through crystal growth of the indium gallium phosphorus (InGaP). In the molecular beam epitaxy (MBE), this process is performed by vapor exposure of each In, Ga and PH3 to grow the semiconductor substrate 28.

(2) Temporarily cease the vapor exposure of In, Ga to postpone the crystal growth of the InGaP substrate 28 when the substrate has grown to several nanometer less than the predetermined final thickness.

(3) Form an atomic doping layer on the InGaP semiconductor crystal by vapor exposing PH3 and the dopant silicon (Si) which is the impurities for the semiconductor. The degree of doping should be small so that the thickness of the doping layer 26 is less than one atomic layer, for example, about $10^{13}$–$10^{14}$/cm$^{-2}$.

(4) Resume the crystal growth of InGaP substrate to form a semiconductor layer 24 over the doping layer 26 for the thickness of several nanometer. This thickness d of InGaP is determined mainly by the relationship between the semiconductor substrate InGaP and the metal material Ti/Au. In this example, excellent contact characteristic is achieved at the thickness d=5 nm (nanometer). In the other combination of materials, preferable results are expected where the thickness d is less than 10 nm.

(5) Finally, form a metal electrode 22 of Ti/Au on the semiconductor layer 24. The structure of ohmic contact electrode of the present invention is formed in the process as described above.

Figure 3:
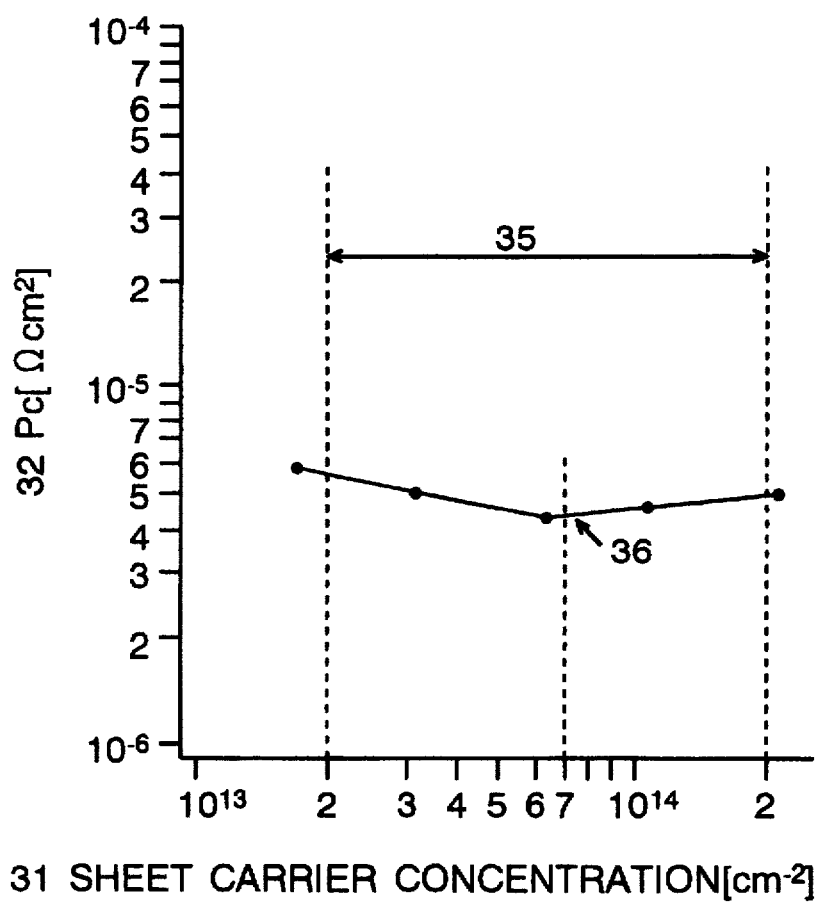
FIG. 3 is a graph showing characteristics of a contact resistance and sheet carrier concentration in the area between the semiconductor and the metal according to the present invention.

FIG. 3 shows experimental results of ohmic contact characteristics and contact resistance in the electrode formed by the above process. Excellent ohmic contact characteristics is attained in a range 35 in FIG. 3 where a sheet carrier concentration is $2\times10^{13}$–$2\times10^{14}$cm$^{-2}$. The contact resistance within this range 35 is 5–6$\times10^{-6}$cm$^2$. The lowest specific resistance of $5\times10^{-6}$cm$^2$ is observed at a point 36 where the atomic layer doping carrier concentration in the layer 26 is $7\times10^{13}$cm$^{-2}$, which is equivalent to the resistance value attained in an alloy junction. This means that the thickness of the semiconductor layer between the atomic doping layer and the metal electrode is large enough for allowing sufficient tunneling for carriers.

The doping level, i.e., the sheet carrier concentration $2\times10^{13}$cm$^{-2}$ is substantially the same as a point where a well bottom 12 in FIG. 1 reaches a Fermi level. This means that an optimum doping level can be determined by the sheet carrier concentration wherein the energy level of the well bottom 12 becomes equal to the Fermi level.

In the foregoing example of the ohmic contact electrode, the indium gallium phosphorus (InGaP) is used as the semiconductor substrate, the titanium/gold (Ti/Au) is used as the metal electrode, and the silicon is used as the impurities to be doped in the semiconductor substrate. The other combinations of materials for the semiconductor substrate, the metal electrode and the impurities are also possible. For example, as the semiconductor substrate, P-type semiconductor, N-type semiconductor, germanium, or gallium arsenide are equally applicable. As the metal electrode materials, aluminum, platinum or tungsten are also applicable. Further, for the dopant, the impurities to be doped in the semiconductor substrate, tin, carbon, beryllium or zinc are also applicable.

The electrode structure by the above combinations, the atomic doping layer should be formed within the range 35 where the energy level exceeds the Fermi level. This structure of electrode achieves an ohmic contact which has higher stability and lower contact resistance than the conventional one. In other words, any metal materials can be used as an electrode if the materials have electric conductivity and are compatible with the semiconductor substrate, and any impurities which can be doped in the semiconductor material to raise the energy level higher than the Fermi level can be used. There is no restriction in the semiconductor materials, thus, any semiconductor materials can be used in forming the electrode of the present invention.

In the foregoing example, the atomic layer doping is achieved by using the crystal growth process such as the molecular epitaxy. Other doping process such as a vapor phase epitaxial growth process can also be used to form the atomic doping layer which has an energy level higher than the Fermi level, i.e. within the range 35 of FIG. 3.

As has been foregoing, according to the present invention, the atomic doping layer is formed in an area of the semiconductor closer to a junction of the semiconductor and the metal electrode. By this arrangement, the Schottky barrier between the semiconductor and the metal is lowered, which establishes an ideal ohmic contact electrode. The ohmic contact electrode of the present invention has lower contact resistance and higher contact stability. Since the contact characteristics of the ohmic contact electrode is directly dependent of the doping level and the position of the doping layer, production of the electrode can be made with high efficiency.

What is claimed is:

1. An ohmic contact electrode for a semiconductor device, comprising:
   a semiconductor substrate;
   an atomic doping layer which is a highly doped, very thin layer of several nanometer developed on said semiconductor substrate, said atomic doping layer being formed by doping impurities such that an energy level of said layer is higher than a Fermi level;

a semiconductor layer developed on said atomic doping layer, said semiconductor layer being formed of the same material as in said semiconductor substrate;

a metal electrode formed on said semiconductor layer for establishing an electric connection with said semiconductor substrate;

wherein said semiconductor layer having a thickness of less than 10 nanometer sufficient for carriers to transfer between said metal electrode and said atomic doping layer by tunneling through said semiconductor layer.

2. An ohmic contact electrode as defined in claim 1, wherein said semiconductor substrate is formed of indium gallium phosphorus (InGaP) and said atomic doping layer has sheet carrier concentration from approximately $2 \times 10^{13}$ to $2 \times 10^{14}$ cm$^{-2}$ by doping said impurities.

3. An ohmic contact electrode as defined in claim 1, wherein said impurities doped in said atomic doping layer is silicon and said metal electrode is titanium/gold (Ti/Au).

\* \* \* \* \*